United States Patent
Forbes

(10) Patent No.: US 6,414,550 B1
(45) Date of Patent: Jul. 2, 2002

(54) CMOS LINEAR AMPLIFIER FORMED WITH NONLINEAR TRANSISTORS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/923,546

(22) Filed: Aug. 8, 2001

(51) Int. Cl.[7] .............................................. H03F 3/18
(52) U.S. Cl. ...................................... 330/264; 330/276
(58) Field of Search ................................ 330/264, 276, 330/149, 295

(56) References Cited

U.S. PATENT DOCUMENTS

| | | | |
|---|---|---|---|
| 1,686,792 A | | 10/1928 | Black |
| 3,202,939 A | * | 8/1965 | Reiling ......................... 330/276 |
| 3,230,467 A | * | 1/1966 | Atherton et al. ............. 330/276 |
| 4,071,830 A | | 1/1978 | Huntington |
| 4,097,814 A | * | 6/1978 | Cohn ........................... 330/276 |
| 4,275,360 A | * | 6/1981 | Gill et al. ..................... 330/276 |
| 6,025,261 A | | 2/2000 | Farrar et al. |
| 6,049,248 A | | 4/2000 | Glas et al. |

OTHER PUBLICATIONS

H.S. Black, "Inventing the Negative Feedback Amplifier", IEEE Spectrum, pp. 55–60, 1977.

T.H. Lee, "The Design of CMOS Radio–Frequency Integrated Circuits", Cambridge Univ. Press, Cambridge, UK and NY, pp. 387–390, 1998.

Y. Ding and R. Harjani, "A +18dBm IIP3 LNA in 0.35 um CMOS" Proc. Int. Solid–State Circuits Conference, San Francisco, Feb. 2001, paper 10.5.

J. L. Dawson, "Power Amplifier Linearization Techniques: An Overview," Workshop on RF circuits for 2.5G and 3G Wireless Systems, 2001 Int. Solid–State Circuits Conf., San Francisco, Feb. 4, 2001.

* cited by examiner

Primary Examiner—Robert Pascal
Assistant Examiner—Henry Choe
(74) Attorney, Agent, or Firm—Dickstein Shapiro Morin & Oshinsky LLP

(57) ABSTRACT

A CMOS amplifier which has improved linear performance by using nonlinear amplifier circuits. The CMOS amplifier provides the same input signal to an NMOS transistor amplifier and a PMOS transistor amplifier. The output of one of the two amplifiers is phase-shifted 180 degrees, and the outputs of both amplifiers are then combined for providing an output signal having reduced nonlinearities.

33 Claims, 8 Drawing Sheets

US 6,414,550 B1

CMOS LINEAR AMPLIFIER FORMED WITH NONLINEAR TRANSISTORS

FIELD OF THE INVENTION

The present invention relates to linear CMOS amplifiers.

BACKGROUND OF THE INVENTION

There is a strong need for power amplifiers to have linear characteristics. Unfortunately, most CMOS transistors often used in amplifier construction are inherently non-linear. Consequently, a technique for accomplishing linear amplification using nonlinear components is desired.

FIG. 1(a) shows a typical CMOS transistor used for amplification. FIG. 1(b) shows the nonlinear I-V (current–voltage) relationship produced by the CMOS amplifier of FIG. 1(a). Equation 1 illustrates the relationship between transistor current $I_{DS}$ and gate voltage $V_{GS}$.

$$I_{DS} = \mu C_o(W/L)((V_{GS}-VT)/2)^2 \quad (1)$$

Let $V_{GS} = V_{GS} + \Delta V \sin(\omega t)$.

$$I_{DS} = \mu C_o(W/L)((V_{GS}-VT) + \Delta V \sin(\omega t))^2$$

$$I_{DS} = \mu C_o(W/L)[(V_{GS}-VT)^2 + 2(V_{GS}-VT)\Delta V \sin(\omega t) + \Delta V^2 \sin^2(\omega t)]$$

Using the trigonometry identity $\sin^2(\omega t) = \frac{1}{2}(1-\cos(2\omega t))$, $$I_{DS} = \mu C_o(W/L)[(V_{GS}-VT)^2 + 2(V_{GS}-VT)\Delta V \sin(\omega t) + \Delta V^2/2 - \frac{1}{2}\Delta V^2 \cos(2\omega t)]$$

Which can be broken down into the components $$I_{DS} = C_o(W/L)[(V_{GS}-VT)^2 + \Delta V^2/2] \quad (2)$$

$$+2(V_{GS}-VT)\Delta V \sin(\omega t) \quad (3)$$

$$-\frac{1}{2}\Delta V^2 \cos(2\omega t)] \quad (4)$$

Equation 1 above represents the well-known square law characteristics of a transistor, where $\mu$ is electron mobility; $C_o$ is capacitance per unit area; W is channel width; L is channel length; $\omega$ is signal frequency, and $\Delta V$ is signal magnitude. Equation component (2) represents the portions of the amplified signal that are DC components. Equation component (3) represents the portions of the input signal that are desired to be amplified. Equation component (4) represents the $2^{nd}$ harmonic components of the amplified signal. A circuit which removes this unwanted harmonic distortion is desired to provide a more linear transistor output.

SUMMARY OF THE INVENTION

In one aspect the invention provides an apparatus and method which provides a linear CMOS amplifier using nonlinear components. The apparatus includes an NMOS transistor amplifier which has a nonlinear output, a PMOS transistor amplifier which also has a nonlinear output, where the NMOS and PMOS transistor amplifiers are connected to the same input source so that the nonlinearities are mirror images of each other, and one or more transformers for combining the outputs of the NMOS and PMOS transistor amplifiers, resulting in the cancellation of the mirror image nonlinearities and reducing the nonlinearity of the CMOS amplifier.

BRIEF DESCRIPTION OF THE DRAWINGS

The foregoing and other features and advantages of the invention will become more apparent from the detailed description of the exemplary embodiments of the invention given below with reference to the accompanying drawings in which.

DETAILED DESCRIPTION OF THE PREFERRED EMBODIMENTS

Figure 1:
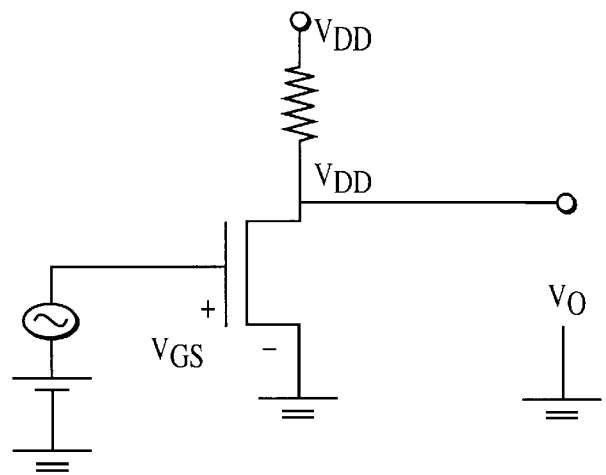
FIG. 1(a) shows a typical CMOS transistor used for amplification.
FIG. 1(b) shows the nonlinear I-V (current–voltage) relationship produced by the CMOS amplifier of FIG. 1(a).
Figure 1:
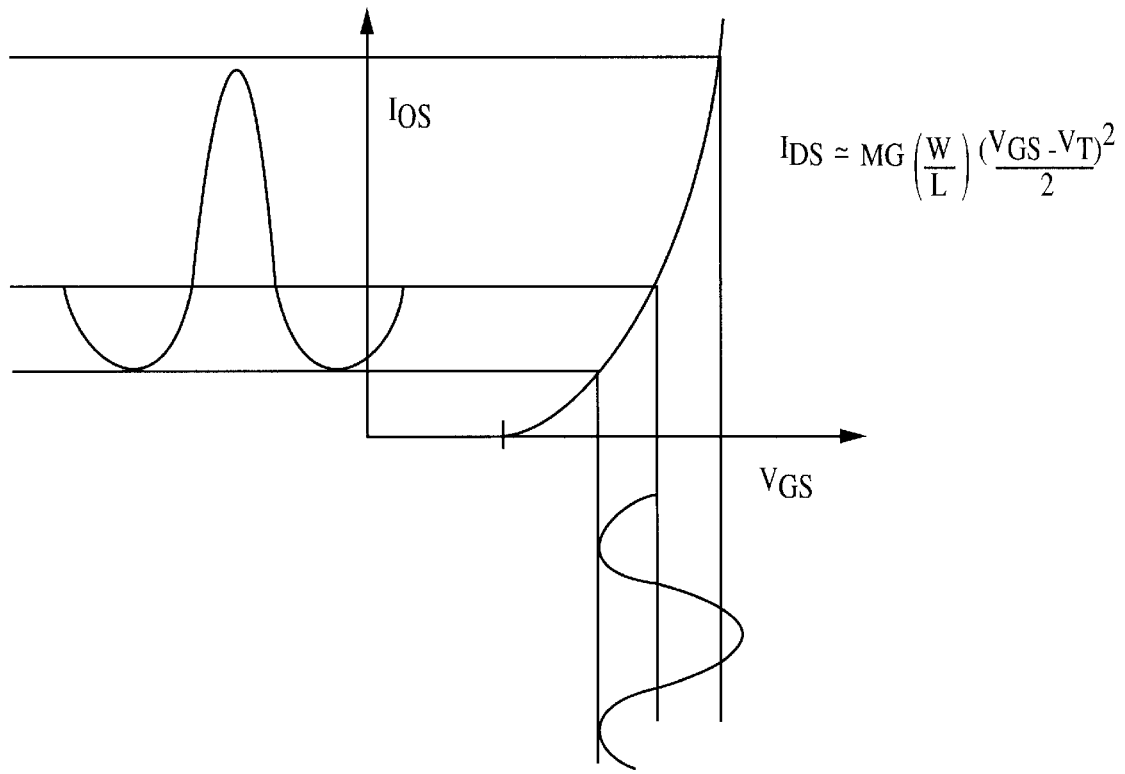
Figure 2:
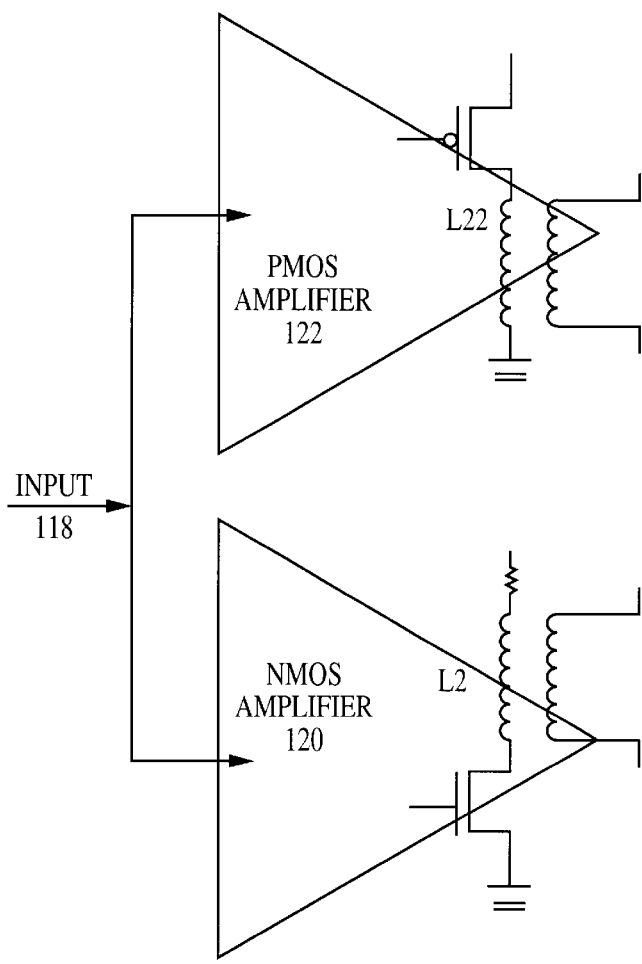
FIG. 2(a) depicts a general technique for compensating for the nonlinear amplification characteristics of CMOS transistor amplifiers.
FIG. 2(b) shows a rough approximation of the outputs of the amplifiers of FIG. 2(a), prior to their combination.
Figure 2:
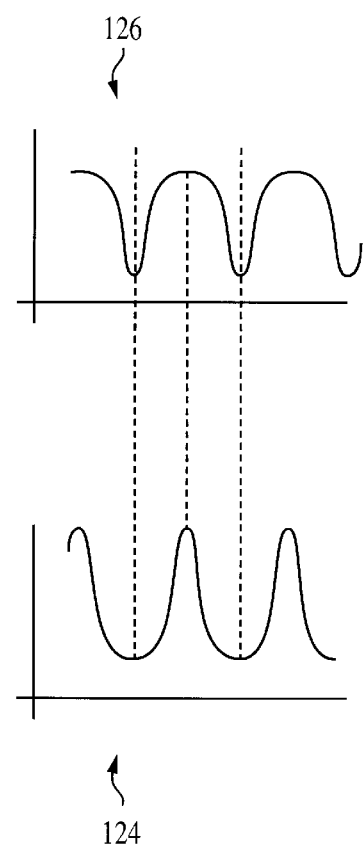

Referring to FIG. 2(a), a general technique in accordance with the present invention for compensating for the nonlinear amplification characteristics of CMOS transistor amplifiers is illustrated. An input signal 118 is used to drive an NMOS transistor amplifier 120, and a similar PMOS transistor amplifier 122, which have transformers L2 and L22, respectively, at their output. For illustrative purposes, the input signal in FIG. 2(a) will be assumed to be a regular sine wave. FIG. 2(b) shows that the theoretical outputs (124, 126) of both transistor amplifiers is somewhat distorted or nonlinear, but in opposite directions. Specifically, the distortion or nonlinearity introduced by the NMOS amplifier 120 causes the output 124 to have somewhat of a 'u' shape. Similarly, the distortion introduced by the PMOS amplifier 122 causes the output 126 to have somewhat of a 'v' shape. However, upon closer examination, it becomes clear that the two outputs 124 and 126 are but mirror images of each other, albeit phase-shifted by 180 degrees. Consequently, adding the two outputs together (and removing the phase shift) should cancel the offsetting nonlinear components introduced by the amplifiers 120 and 122.

Figure 3:
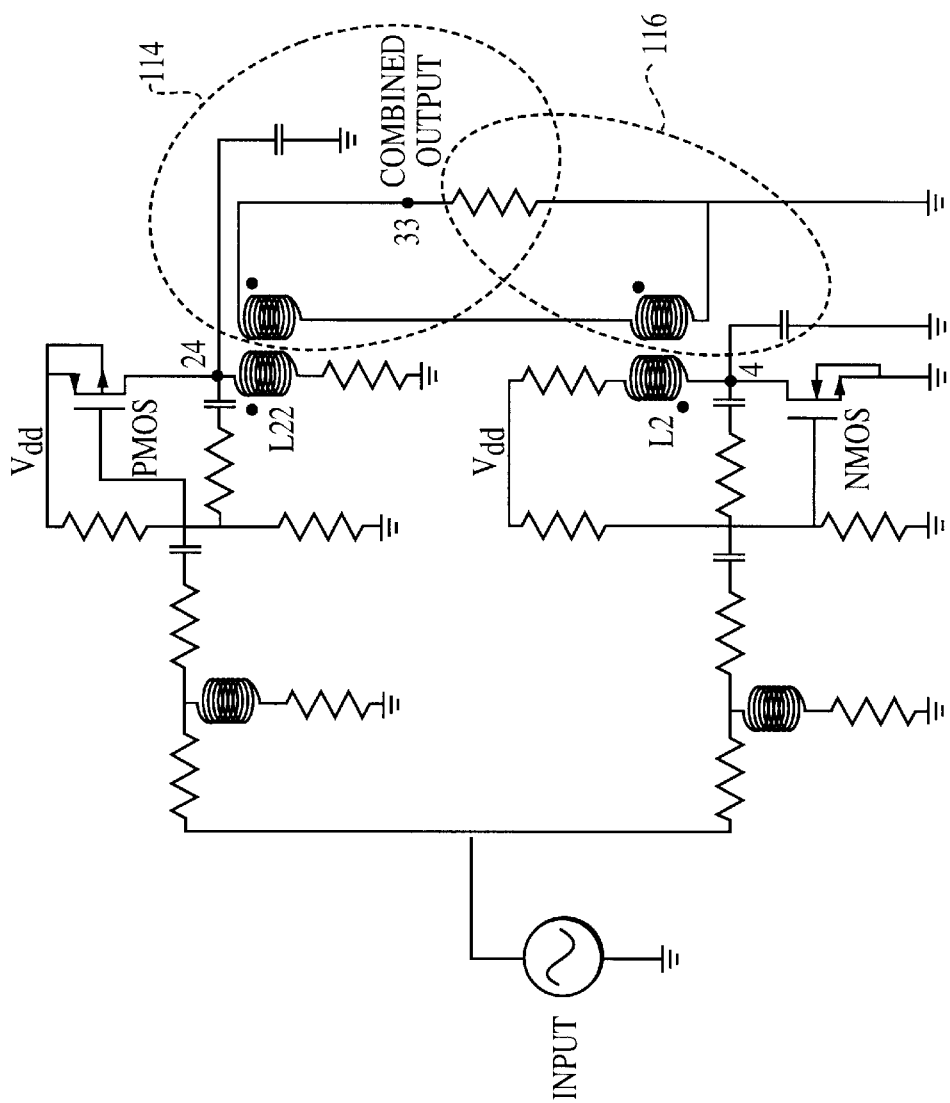
FIG. 3 shows a more specific version of the generalized circuit of FIG. 2(a).

FIG. 3 shows a more specific version of the generalized circuit of FIG. 2(a). The outputs of the NMOS and PMOS transistor amplifiers 120 and 122 are combined at a resistor 33. Also, the windings of transformer L2 are shown as having opposite polarities, while the windings of transformer L22 is shown to have the same polarity, as indicated by the alignment of black dots near the transformers in FIG. 3. The result will be that transformer L2 will introduce a phase shift of 180 degrees in the output of the NMOS transistor amplifier before the two amplifier outputs are combined.

Figure 4:
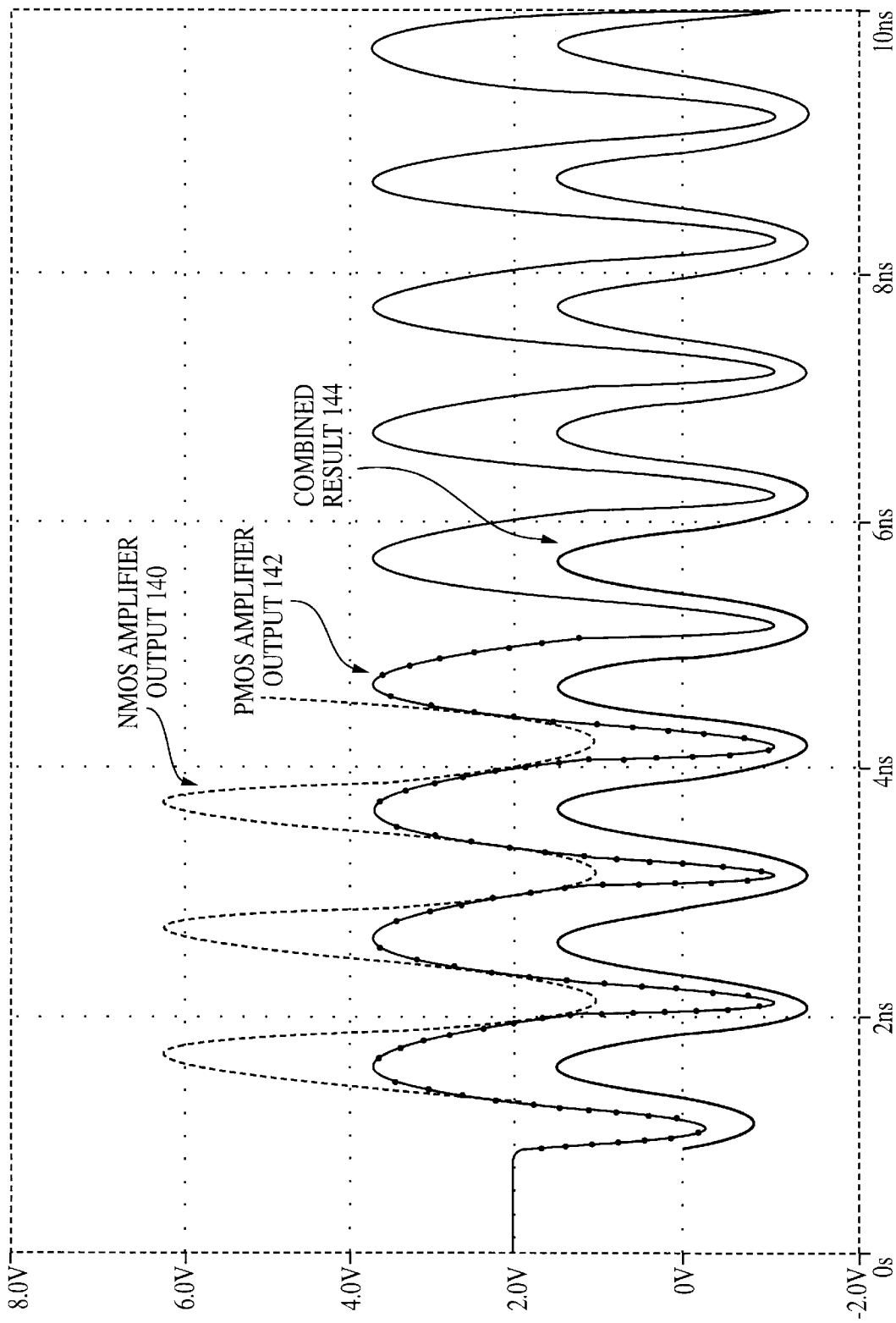
FIG. 4(a) illustrates actual outputs from each of the transistor amplifiers as well as their combined output, captured from an oscilloscope.
FIG. 4(b) shows the frequency components of the NMOS and PMOS transistor amplifier outputs as well as the frequency components of the combined signal, captured from a spectrum analyzer.
Figure 4:
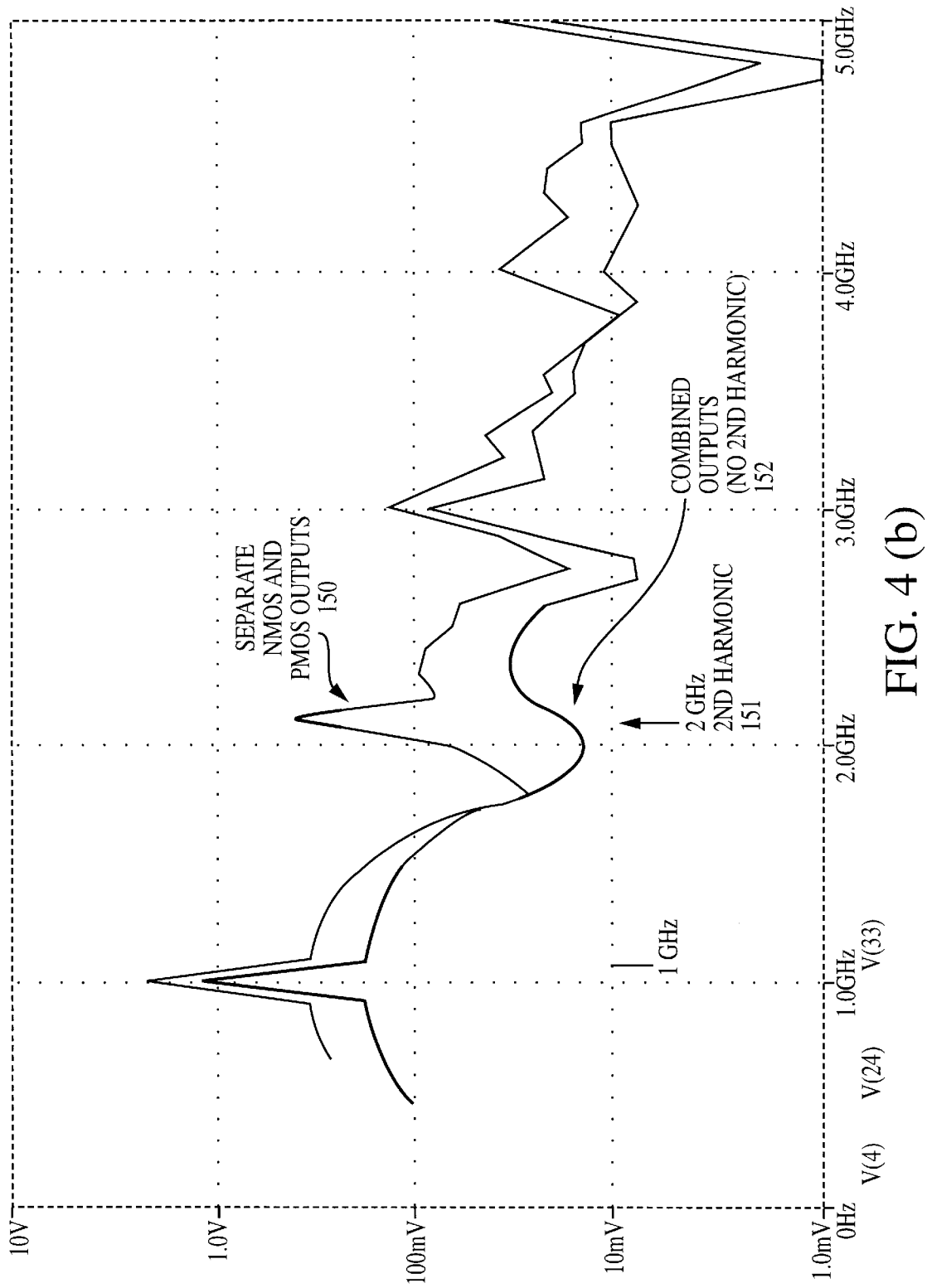

FIG. 4(a) illustrates actual outputs (140, 142) from each of the NMOS and PMOS transistor amplifiers as well as their combined output 144, captured from an oscilloscope. FIG. 4(b) illustrates the frequency components of the outputs of the NMOS and PMOS transistor amplifiers. The input signal used to generate both FIGS. 4(a) and 4(b) is a 1 GHz sine wave, and the notations V(4), V(24), and V(33) in FIG. 4(a) and 4(b) correspond to nodes 4, 24, and 33 shown in FIG. 3. As shown in FIG. 4(a), the actual NMOS amplifier output 140 is somewhat 'u' shaped, while the actual PMOS amplifier output 142 is somewhat 'v' shaped. Also as predicted, the combined result 144 of the two amplifiers has a more sinusoidal shape, and has virtually eliminated the 'v' and 'u' shaped distortion. Thus, the combined output 144 is similar to the original non-distorted 1 GHz sine wave, albeit amplified.

FIG. 4(b) further illustrates the improved nonlinearity achieved by the present invention. FIG. 4(b) shows the frequency components 150 of the NMOS and PMOS transistor amplifier outputs, as well as the frequency components 152 of the combined signal, captured from a spectrum analyzer. From FIG. 4(b) it can be seen that the NMOS and PMOS amplifier outputs each have a strong $2^{nd}$ harmonic component 151, but that the combination of the two outputs has a negligible $2^{nd}$ harmonic component 152.

The following is a mathematical explanation illustrating how the FIG. 3 circuit also cancels the unwanted intermodulation distortion components introduced by the non-linearity of the CMOS transistor amplifiers contained therein. Because there are two separate transistors in the circuit operating at potentially two different frequencies $\omega_1$ and $\omega_2$, symbols with the subscript 1 apply to one of the frequency components while symbols with the subscript 2 apply to the other frequency component. Also, because there are two potentially differing frequencies operating in the circuit, this gives rise to another type of unwanted distortion known as intermodulation distortion. Applying the square law first to the NMOS transistor, the following results occur:

$$i_{ds} = \mu C_o(W/L)[(V_{GS}-VT)+\Delta V_1 \cos(\omega_1 t)+\Delta V_2 \cos(\omega_2 t)]^2 \quad (5)$$

which can be expressed as the following components:

$$i_{ds} = \mu C_o(W/L)[(V_{GS}-VT)^2 \quad (6)$$

$$+2(V_{GS}-Vt)\Delta V_1 \cos(\omega_1 t)+2(V_{GS}-VT)\Delta V_2 \cos(\omega_2 t) \quad (7)$$

$$+2\Delta V_1 \Delta V_1 \cos(\omega_1 t)\cos(\omega_2 t) \quad (8)$$

$$+\Delta V_1^2 \cos^2(\omega_1 t) \quad (9)$$

$$+\Delta V_2^2 \cos^2(\omega_2 t)] \quad (10)$$

Component (6) of the equation is the DC component of the output of the NMOS amplifier, component (7) are the fundamental frequency components, component (8) is the intermodulation component, and components (9) and (10) are the second harmonics of $\omega_1$ and $\omega_2$, respectively.

Applying the same square law to the PMOS transistor, the following results occur:

$$|i_{ds}|=\mu C_o(W/L)[(V_{GS}-VT)-\Delta V_1 \cos(\omega_1 t)-\Delta V_2 \cos(\omega_2 t)]^2 \quad (11)$$

which can be expressed as the following components $$|i_{ds}|=\mu C_o(W/L)[(V_{GS}-VT)^2 \quad (12)$$

$$-2(V_{GS}-VT)\Delta V_1 \cos(\omega_1 t)-2(V_{GS}-VT)\Delta V_2 \cos(\omega_2 t) \quad (13)$$

$$+2\Delta V_1 \Delta V_1 \cos(\omega_1 t)\cos(\omega_2 t) \quad (14)$$

$$+\Delta V_1^2 \cos^2(\omega_1 t) \quad (15)$$

$$+\Delta V_2^2 \cos^2(\omega_2 t)] \quad (16)$$

Component (12) is the DC component of the output of the PMOS amplifier, component (13) are the fundamental frequency components, component (14) is the intermodulation component, and components (15) and (16) are the second harmonics of $\omega_1$ and $\omega_2$, respectively. To determine the behavior of the FIG. 3 circuit, the above components (6–10) and (12–16) are added together, with a 180 degree phase shift at the output of the PMOS transistor, which then reverses the sign of the fundamental frequency, intermodulation, and $2^{nd}$ harmonic components shown above in components (13) through (16). Consequently, the actual 180 degree phase shifted behavior of the PMOS amplifier is more accurately described in the revised signal components (13) through (16), restated below:

$$+2(V_{GS}-VT)\Delta V_1 \cos(\omega_1 t)+2(V_{GS}-VT)\Delta V_2 \cos(\omega_2 t) \quad (13)$$

$$-2\Delta V_1 \Delta V_1 \cos(\omega_1 t)\cos(\omega_2 t) \quad (14)$$

$$-\Delta V_1^2 \cos^2(\omega_1 t) \quad (15)$$

$$-\Delta V_2^2 \cos^2(\omega 2t) \quad (16)$$

When adding the NMOS components (6–10) to the PMOS components (13–16), after accounting for the 180 degree phase shift introduced by transformer L2 (see FIG. 3), it is apparent that the fundamental frequency components add together, while the intermodulation and second harmonic components cancel each other. Because of the cancellation of these unwanted nonlinear components, linear amplification using nonlinear An additional feature of the amplifier circuit of the present invention is that the output inductor, resistor, and capacitor combinations form parallel resonance circuits (elements 114, 116 in FIG. 3) which can be tuned or adjusted to provide maximum gain at a particular frequency. Such a parallel resonance circuit can also provide frequency selectivity by attenuating unwanted frequencies.

Figure 5:
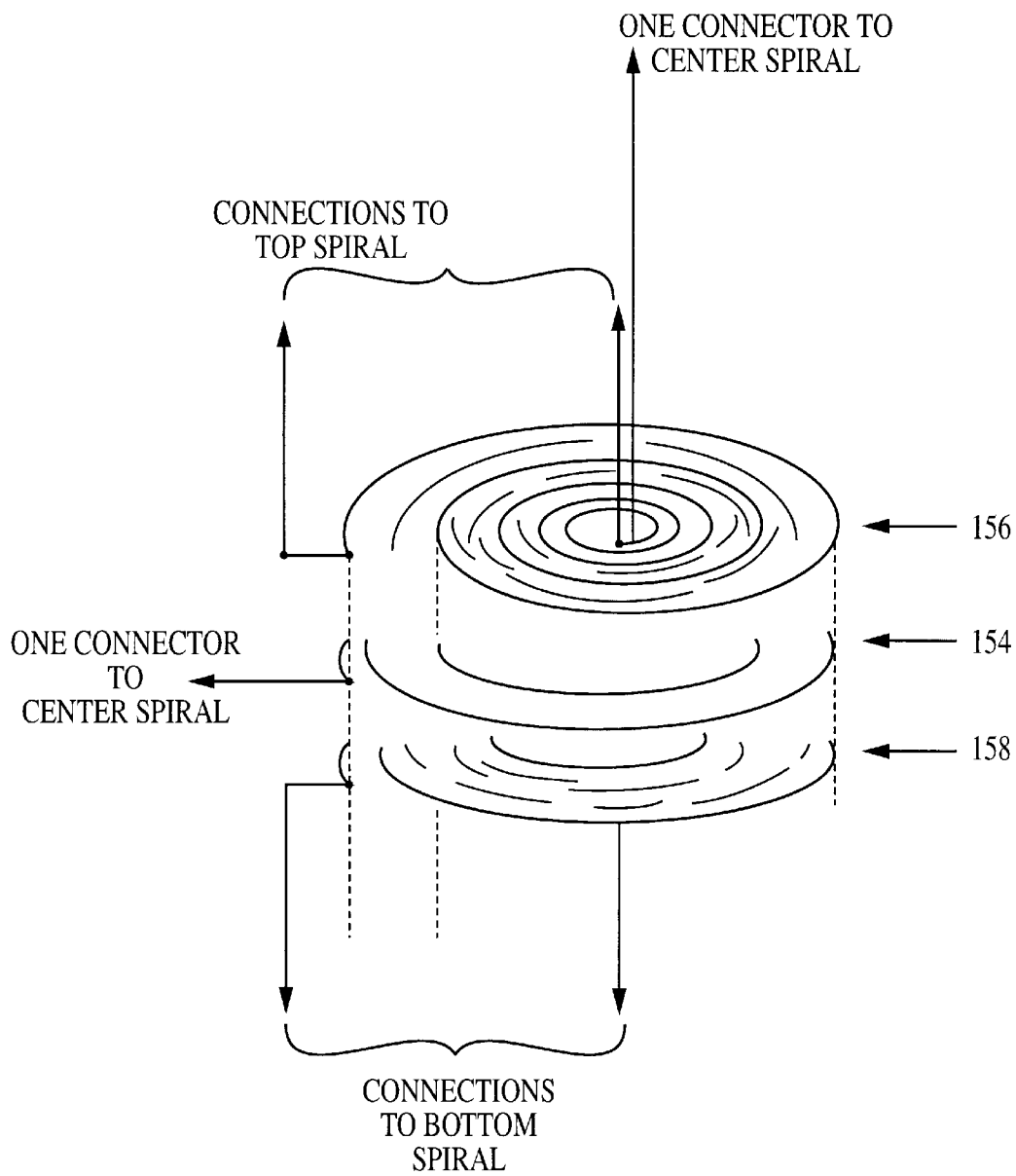
FIG. 5(a) depicts the use of two spiral inductor transformers mutually coupled to a center spiral inductor for combining the output of the NMOS and PMOS transistor amplifiers.
FIG. 5(b) shows the amplifier circuit of the present invention modified to incorporate the two spiral inductor transformers mutually coupled to a center spiral inductor shown in FIG. 5(a).
Figure 5:
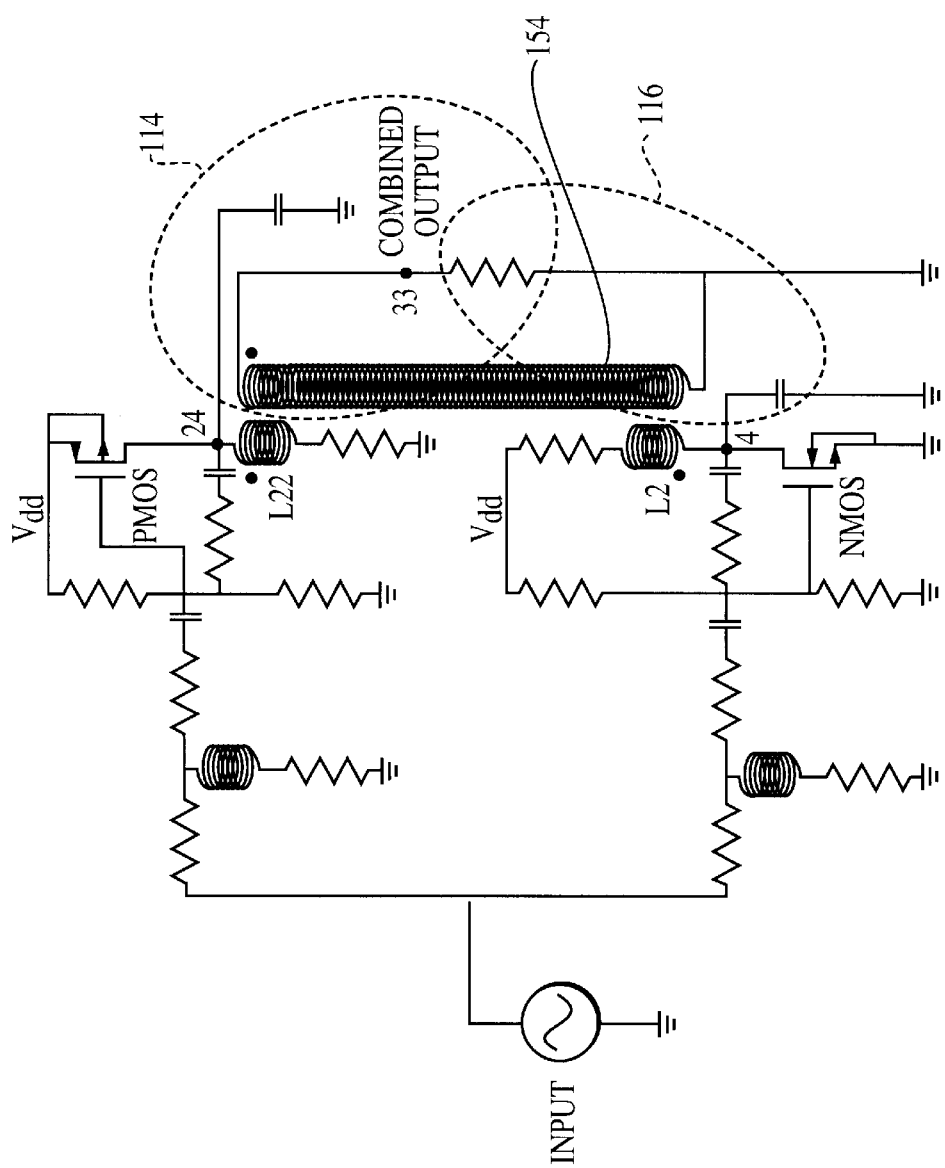

FIG. 5(a) shows the use of two spiral inductor transformers as the transformers L2 and L22 of FIG. 3. The circuit of FIG. 3 depicts separate transformers L2 and L22 at the output of each NMOS and PMOS transistor amplifier, with each transformer having two coils. FIG. 5(a) shows transformers an upper spiral inductor 156 and a lower spiral inductor 158 being mutually coupled to a center spiral inductor 154. This center inductor 154 shields the two outer inductors from each other, thus preventing any mutual coupling therebetween. FIG. 5(b) shows the transformers L2 and L22 mutually coupled to such a center spiral inductor 154. The signal waveforms in FIGS. 4(a) and 4(b) was obtained from a circuit incorporating two spiral inductor transformers mutually coupled to a center spiral inductor in the manner depicted in FIG. 5(b). Such a dual spiral inductor transformer arrangement is more convenient to manufacture with existing integrated circuit fabrication methods than the separate transformer arrangement of FIG. 3. As shown in FIG. 5(b), this circuit also employs the twin parallel resonance circuits 114 and 116.

Finally, throughout this specification it has been assumed that the PMOS amplifier 122 has characteristics matching with the NMOS amplifier 120. However, to achieve greater equality between the two outputs, the size of the PMOS amplifier may be made larger. This is because of the lower hole mobility known to occur in PMOS devices. It should also be noted that FIGS. 3 and 5(b) are merely representative of many different types of amplifier architectures which may employ the present invention, including but not limited to RF and other wireless communication amplifier circuits.

Figure 6:
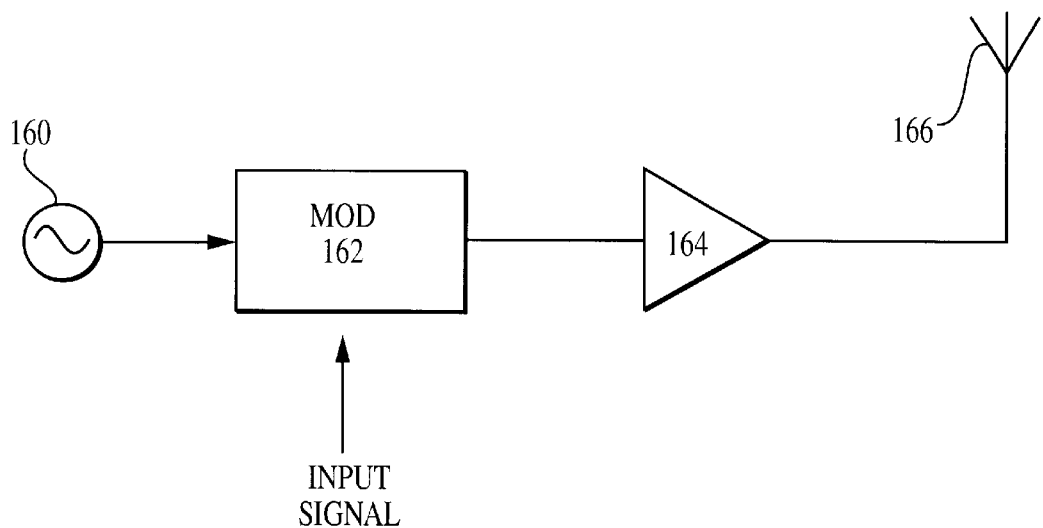
FIG. 6 shows the present invention used within a transmitter circuit.

FIG. 6 shows the present invention used within a transmitter circuit. An oscillator 160 is connected to a modulator 162, which modulates the input signal that is desired to be amplified. The modulated signal is then passed to a CMOS linear amplifier 164 of the present invention, where the signal is then transmitted to antenna 166.

Figure 7:
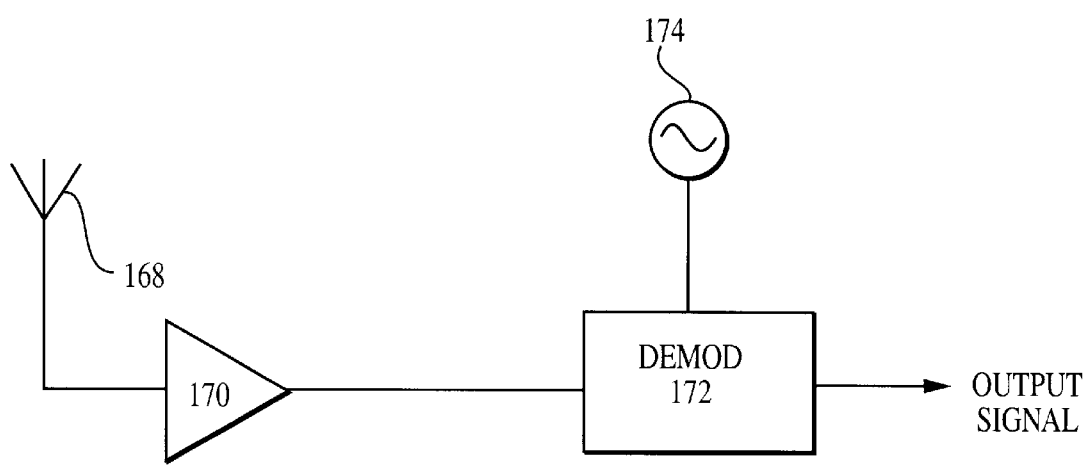
FIG. 7 shows the present invention used within a receiver circuit.

FIG. 7 shows the present invention used within a receiver circuit. The desired signal is first received at antenna 168, where it is passed to a CMOS linear amplifier 170 of the present invention. The signal is then passed to demodulator 172, which in combination with oscillator 174 demodulates and then outputs the desired signal.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A CMOS amplifier, comprising:
   an NMOS amplifier circuit which has a nonlinear output;
   a PMOS amplifier circuit which has a non linear output;
   said NMOS and PMOS amplifier circuits being connected to the same input source;
   a transformer circuit for combining the outputs of said NMOS and PMOS amplifier circuits in a manner which causes non-linear components in the output signals of said NMOS and PMOS amplifier circuits to cancel.

2. The CMOS amplifier of claim 1, further comprising:
   respective parallel resonant circuits provided at output stages of said PMOS and NMOS amplifier circuits.

3. The CMOS amplifier of claim 1, wherein said transformer circuit comprises first and second transformers each having two coils;
   said first transformer having coils wound to provide an output signal having the same polarity as the input signal applied to said first transformer; and
   said second transformer having coils wound to provide an output signal which is of opposite polarity with respect to the input signal applied to said second transformer.

4. The CMOS amplifier of claim 1, wherein said output transformer comprises first and second spiral inductors mutually coupled to a common spiral inductor to provide a doubly-coupled transformer.

5. The CMOS amplifier of claim 4, wherein said first spiral inductor is wound to have the same polarity as said common spiral inductor and thus provide a signal which is in phase with said a first input signal to said output transformer; and
   said second spiral inductor being wound to have an opposite polarity as said common spiral inductor and thus provide a signal which is 180° out of phase with a second input signal to said output transformer.

6. The CMOS amplifier of claim 4, wherein said common spiral inductor electrically shields the first and second spiral inductors from each other.

7. The CMOS amplifier as in claim 6 wherein said first and second spiral inductors are arranged as outer spiral conductors and said common spiral inductor is arranged as a center spiral inductor.

8. The CMOS amplifier as in claim 5 wherein said first and second spiral inductors are fabricated in the same integrated circuit as said NMOS and PMOS amplifier circuits.

9. The CMOS amplifier of claim 1, wherein the size of the PMOS transistor contained within said PMOS amplifier is larger than that of the NMOS transistor contained within said NMOS amplifier.

10. A method for reducing nonlinearity in a CMOS amplifier, comprising:
    amplifying an input signal to an NMOS amplifier circuit;
    amplifying said input signal with a PMOS amplifier circuit;
    combining the outputs of said NMOS and PMOS amplifier circuits to produce an output signal in a manner which reduces non-linearities in said output stages caused by non-linearities in said NMOS and PMOS amplifier circuits.

11. The method of claim 10, wherein said NMOS and PMOS amplifier circuits include respective resonant circuits.

12. The method of claim 10, wherein said act of combining comprises:
    passing said output of said PMOS amplifier through a first transformer circuit;
    passing said output of said NMOS amplifier through a second transformer circuit;
    phase-shifting the output of one of said NMOS and PMOS amplifiers by 180° as seen at the output of a respective transformer; and
    combining the outputs of said transformers.

13. The method of claim 11, wherein said first and second transformer circuits comprise first and second outer spiral inductors mutually coupled to a center spiral inductor.

14. The method of claim 13, further comprising electrically shielding the two outer spiral inductors from each other with said center spiral inductor.

15. The linear CMOS amplifier of claim 10 wherein the size of said PMOS transistor is larger than said NMOS transistor.

16. A signal transmitter comprising:
    an input terminal for receiving an input signal;
    an output terminal for providing an output signal; and
    a CMOS amplifier provided between said input and output terminals, said CMOS amplifier comprising:
    an NMOS amplifier circuit which has a nonlinear output;
    a PMOS amplifier circuit which has a non linear output;
    said NMOS and PMOS amplifier circuits being connected to the same input source;
    a circuit for combining the outputs of said NMOS and PMOS amplifier circuits in a manner which causes non-linear components in the output signals of said NMOS and PMOS amplifier circuits to cancel.

17. The signal transmitter of claim 16, further comprising:
    respective parallel resonant circuits provided at output stages of said PMOS and NMOS amplifier circuits.

18. The signal transmitter of claim 16, wherein said combining circuit comprises a transformer circuit, said transformer circuit comprising first and second transformers each having two coils;

said first transformer having coils wound to provide an output signal having the same polarity as the input signal applied to said first transformer; and said second transformer having coils wound to provide an output signal which is of opposite polarity with respect to the input signal applied to said second transformer.

19. The signal transmitter of claim 16, wherein said output transformer comprises first and second spiral inductors mutually coupled to a common spiral inductor to provide a doubly-coupled transformer.

20. The signal transmitter of claim 19, wherein said first spiral inductor is wound to have the same polarity as said common spiral inductor and thus provide a signal which is in phase with said a first input signal to said output transformer; and said second spiral inductor being wound to have an opposite polarity as said common spiral inductor and thus provide a signal which is 180° out of phase with a second input signal to said output transformer.

21. The signal transmitter of claim 19, wherein said common spiral inductor electrically shields the first and second spiral inductors from each other.

22. The signal transmitter as in claim 21 wherein said first and second spiral inductors are arranged as outer spiral conductors and said common spiral inductor is arranged as a center spiral inductor.

23. The signal transmitter as in claim 20 wherein said first and second spiral inductors are fabricated in the same integrated circuit as said NMOS and PMOS amplifier circuits.

24. The signal transmitter of claim 16, wherein the size of the PMOS transistor contained within said PMOS amplifier is larger than that of the NMOS transistor contained within said NMOS amplifier.

25. A signal receiver comprising:

an input terminal for receiving an input signal;

an output terminal for providing an output signal; and a CMOS amplifier provided between said input and output terminals, said CMOS amplifier comprising:

an NMOS amplifier circuit which has a nonlinear output;

a PMOS amplifier circuit which has a non linear output;

said NMOS and PMOS amplifier circuits being connected to the same input source;

a circuit for combining the outputs of said NMOS and PMOS amplifier circuits in a manner which causes non-linear components in the output signals of said NMOS and PMOS amplifier circuits to cancel.

26. The signal receiver of claim 25, further comprising:

respective parallel resonant circuits provided at output stages of said PMOS and NMOS amplifier circuits.

27. The signal receiver of claim 25, wherein said combining circuit comprises a transformer circuit, said transformer circuit comprising first and second transformers each having two coils;

said first transformer having coils wound to provide an output signal having the same polarity as the input signal applied to said first transformer; and said second transformer having coils wound to provide an output signal which is of opposite polarity with respect to the input signal applied to said second transformer.

28. The signal receiver of claim 25, wherein said output transformer comprises first and second spiral inductors mutually coupled to a common spiral inductor to provide a doubly-coupled transformer.

29. The signal receiver of claim 28, wherein said first spiral inductor is wound to have the same polarity as said common spiral inductor and thus provide a signal which is in phase with said a first input signal to said output transformer; and said second spiral inductor being wound to have an opposite polarity as said common spiral inductor and thus provide a signal which is 180° out of phase with a second input signal to said output transformer.

30. The signal receiver of claim 28, wherein said common spiral inductor electrically shields the first and second spiral inductors from each other.

31. The signal receiver as in claim 30 wherein said first and second spiral inductors are arranged as outer spiral conductors and said common spiral inductor is arranged as a center spiral inductor.

32. The signal receiver as in claim 29 wherein said first and second spiral inductors are fabricated in the same integrated circuit as said NMOS and PMOS amplifier circuits.

33. The signal receiver of claim 25, wherein the size of the PMOS transistor contained within said PMOS amplifier is larger than that of the NMOS transistor contained within said NMOS amplifier.

* * * * *

UNITED STATES PATENT AND TRADEMARK OFFICE
CERTIFICATE OF CORRECTION

PATENT NO. : 6,414,550 B1
DATED : July 2, 2002
INVENTOR(S) : Leonard Forbes

It is certified that error appears in the above-identified patent and that said Letters Patent is hereby corrected as shown below:

Column 4,
Line 40, after the word "nonlinear" add -- CMOS transistor amplifiers is achieved. --

Signed and Sealed this

Nineteenth Day of November, 2002

Attest:

JAMES E. ROGAN
Attesting Officer   Director of the United States Patent and Trademark Office